United States Patent [19]
Bae et al.

[11] Patent Number: 5,968,111
[45] Date of Patent: Oct. 19, 1999

[54] CIRCULAR MEDIAN FILTER

[75] Inventors: Moo-Ho Bae; Ju-Hyung Lee, both of Seoul, Rep. of Korea

[73] Assignee: Medison Co., Ltd., Rep. of Korea

[21] Appl. No.: 09/018,003

[22] Filed: Feb. 3, 1998

[30] Foreign Application Priority Data

Feb. 4, 1997 [KR] Rep. of Korea ................. 97-3420

[51] Int. Cl.$^6$ ................................................. G06F 7/00
[52] U.S. Cl. ................................. 708/202; 708/304
[58] Field of Search ................................ 708/202, 304

[56] References Cited

U.S. PATENT DOCUMENTS

| | | | |
|---|---|---|---|
| 4,672,567 | 6/1987 | Kelly et al. | 708/202 |
| 4,713,786 | 12/1987 | Roskind | 708/202 |
| 4,951,242 | 8/1990 | Hobson | 708/202 |
| 5,708,595 | 1/1998 | Connell | 708/202 |
| 5,900,006 | 5/1999 | Yoon | 708/202 |

Primary Examiner—Tan V. Mai
Attorney, Agent, or Firm—Dilworth & Barrese

[57] ABSTRACT

A circular median filter outputs a median value among data expressed as angles as well as magnitudes. If external new data is input to the circular median filter, a plurality of median cells delete the firstly input data among a plurality of prestored data and sort a plurality of data including the remaining prestored data and the newly input data after deletion of the firstly input data on the basis of a data magnitude. A median determiner receives the sorted data from the plurality of median cells, selects particular data corresponding to a maximum distance from the sorted data, and then outputs the selected particular data as median data. Here, the maximum distance is a maximum value among distances representing differences between data stored in two neighboring median cells among the plurality of median cells for storing the sorted data, and the particular data is data received from the median cell which is the farthest from the two median cells corresponding to the maximum distance.

5 Claims, 3 Drawing Sheets

5,968,111

CIRCULAR MEDIAN FILTER

BACKGROUND OF THE INVENTION

The present invention relates to a median filter, and more particularly, to a circular median filter which can provide a median value with respect to data expressed as magnitudes or angles.

A median filter is a non-linear filter which outputs data of a medium magnitude as a median value among a predetermined number of data. The median filter has an excellent filter characteristics in which impulse noise is removed from the received data effectively and a boundary portion of an image does not deteriorate. Having theses characteristics, the median filter is widely used for video signal processing in TVs or medical equipment.

FIG. 1 shows an existing median filter, particularly a four degree median filter. In FIG. 1, median cells 11–15 store five data values which are recently input. The five data values stored in the median cells 11–15 are sorted in a descending order from the data value stored in the leftmost median cell 11. The data value DATA_IN input to the median filter of FIG. 1 is individually compared with the stored data values in the median cells 11–15. Then, according to the comparison result, the input data is stored in one of th median cells 11–15 in a manner that a descending order is maintained. At the same time, the data which was firstly input to the median filter of FIG. 1 is deleted. In this manner, the data stored in the respective median cells 11–15 always maintain a descending order. As a result, the median filter can output a middle value stored in the median cell 13 which is positioned in the middle of the median cells 11–15, as a median value OUT.

FIG. 2A shows a definition domain of data expressed as magnitudes on a line segment $\overline{AB}$, in which A is a minimum value and B is a maximum value. When the median filter of FIG. 1 sorts five data values X[0], X[1], X[2], X[3] and X[4] expressed as magnitudes as shown in FIG. 2A, the median filter is appropriate to the case where a median value is provided considering only magnitudes of the input data because the data X[3] is the middle value. Meanwhile, FIG. 2B shows a definition domain of data expressed as angles on a circle C, in which angles "0" and "2π" correspond to the same point on the circle C. Therefore, points on the circle C corresponding to angles have a circularly corresponding relationship as angle increases. In the case when the following data belonging to the definition domain shown in FIG. 2B are input, $R[0]=\theta_1, R[1]=\theta_2, R[2]=\theta_3, R[3]=2\pi-\theta_1, R[4]=2\pi-\theta_2$ where $0<\theta_1<\theta_2<\theta_3<\pi/2$, since the existing median filter compares only magnitudes of data, R[2] is output as a median value, which is not a desired median value. The desired median value is Rx[0] as shown in FIG. 2B. Thus, the existing median filter does not provide an appropriate median value with respect to data expressed as angles.

SUMMARY OF THE INVENTION

To solve the above problem, it is an object of the present invention to provide a circular median filter which can provide a median value with respect to data expressed as angles as well as data expressed as magnitudes.

To accomplish the above object of the present invention, there is provided a circular median filter comprising: a plurality of median cells in response to externally input data for deleting the firstly input data among a plurality of prestored data and sorting a plurality of data including the remaining prestored data and the newly input data after deletion of the firstly input data on the basis of a data magnitude; and a median determiner for receiving the sorted data output from the plurality of median cells, selecting particular data corresponding to a maximum distance from the received sorted data, and outputting the selected particular data as median data.

The maximum distance is a maximum value among distances representing differences between data stored in two neighboring median cells among the plurality of median cells for storing the sorted data.

The particular data is data received from the median cell which is the farthest from the two median cells corresponding to the maximum distance.

BRIEF DESCRIPTION OF THE DRAWINGS

The preferred embodiment is described with reference to the drawing wherein.

DETAILED DESCRIPTION OF THE PREFERRED EMBODIMENT

A preferred embodiment of the present invention will be described in detail with reference to the accompanying drawings.

Figure 1:
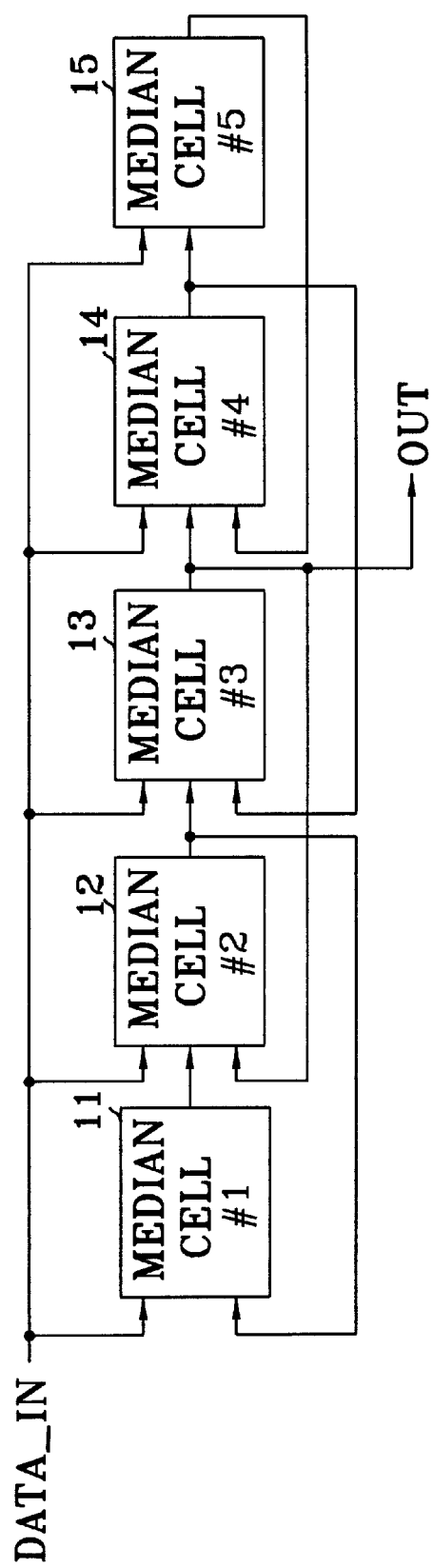
FIG. 1 is a block diagram of an existing median filter.
Figure 3:
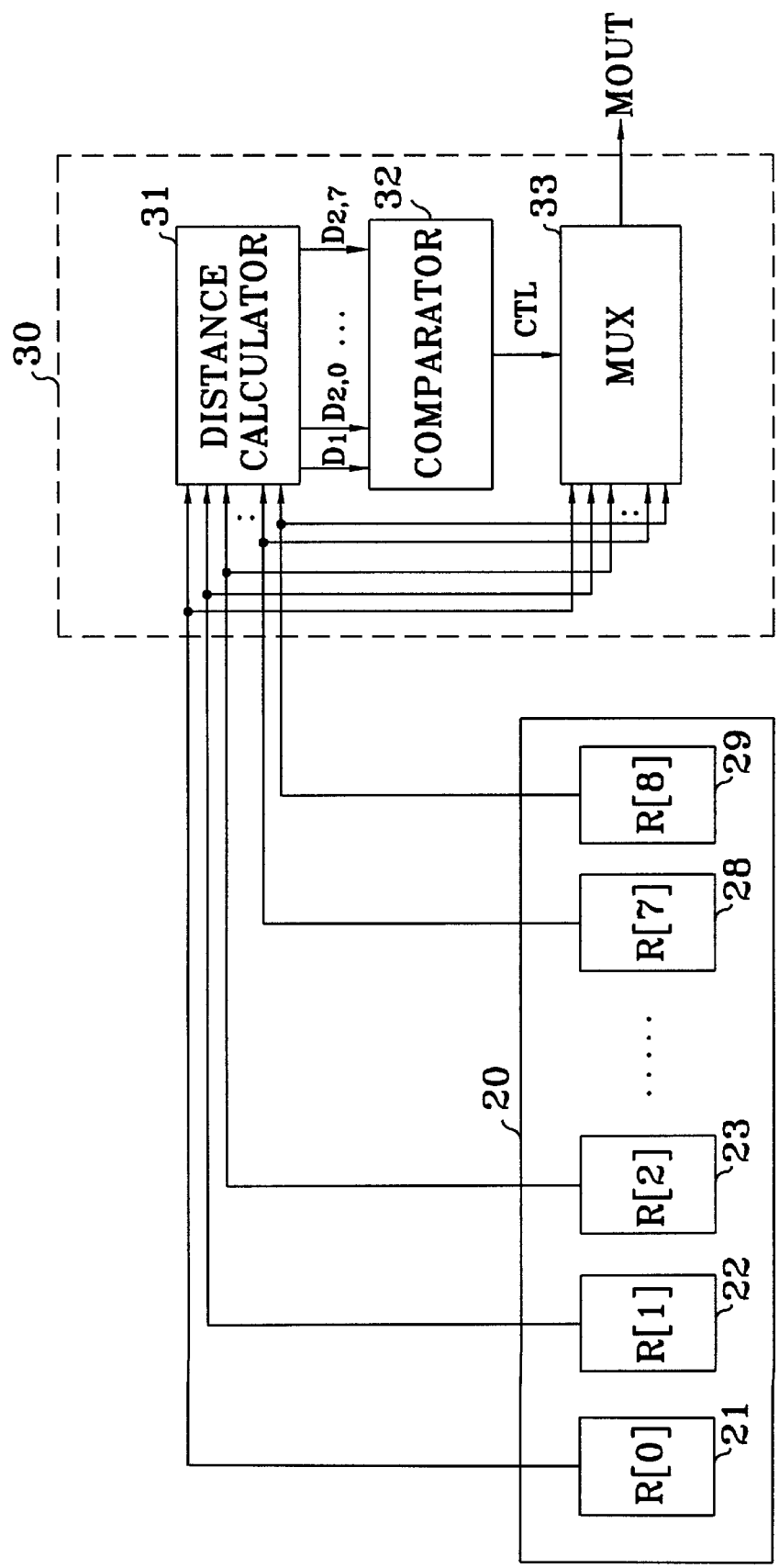
FIG. 3 is a block diagram of a circular median filter according to a preferred embodiment of the present invention.
Figure 2B:
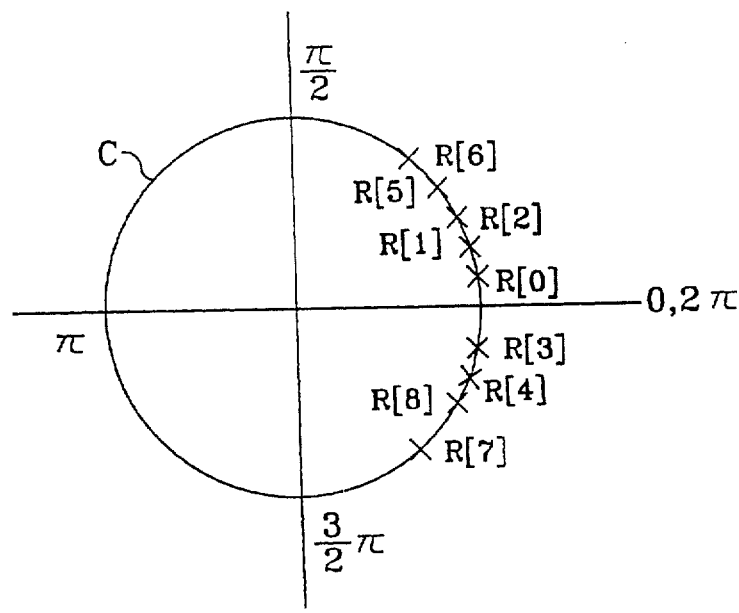
Figure 4:
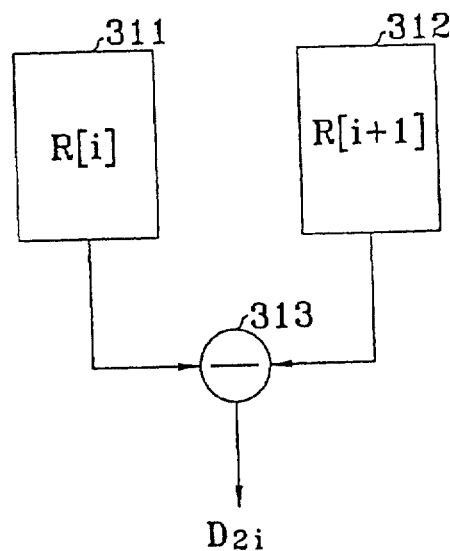

FIG. 3 shows a circular median filter according to a preferred embodiment of the present invention, and shows an example of eight-degree circular median filter. In FIG. 3, a data sorter 20 sorts input data in a magnitude sequence. The data sorter 20 includes median cells 21–29 which sort data in the same manner as that of the median cells 11–15 shown in FIG. 1. Thus, data connection lines being concerned with data sorting of the median cells 21–29 are omitted in FIG. 3. The median cells 21–29 are constructed to supply the sorted data to a distance calculator 31 and a multiplexer 33 in a median determiner 30. When external data is input to the data sorter 20, the median cells 21–29 delete the oldest input data among the nine prestored data, and performs an sorting and storage operation with respect to a newly input data and eight prestored data excluding the oldest input data. As a result, the nine data including the one newly input data is stored in a descending order from the leftmost median cell 21 to the rightmost median cell 29. The sorted data stored in the median cells 21–29 are supplied to the median determiner 30.

The median determiner 30 includes a distance calculator 31 and a multiplexer 33 both which receive the nine data supplied from the median cells 21–29, and a comparator 32 for performing a comparison operation of distance data output from the distance calculator 31 and supplying a comparison result signal CTL representing the comparison result to the multiplexer 33. The distance calculator 31 calculates a distance between the two neighboring data with respect to the nine data supplied from the median cells 21–29 in the data sorter 20. In more detail, the distance calculator 31 calculates a distance $D_{2i}$ with respect to two data stored in two neighboring median cells (for example, the median cells 21 and 22) in the data sorter 20, using the following equation (1).

$$D_{2i}=|R[i]-R[i+1]| \text{ where } 0 \leq i \leq 7 \qquad (1)$$

Here, R[i] denotes data stored in a median cell.

Figure 4:
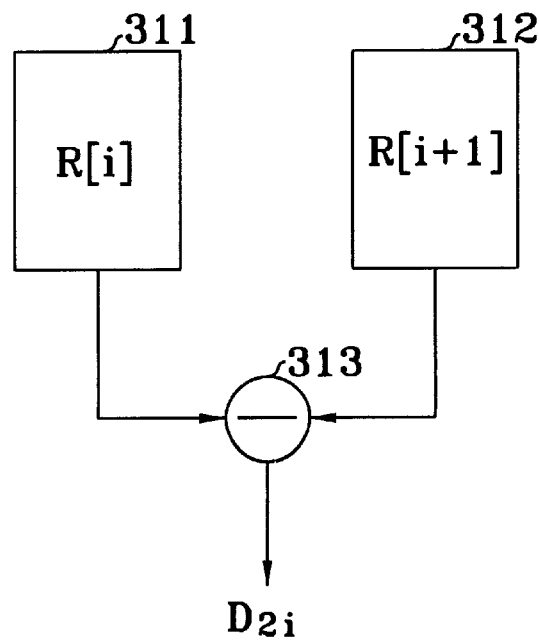
FIG. 4 is conceptual block diagram for explaining calculation of a distance in a distance calculator shown in FIG. 3.

FIG. 4 shows a logic implement of the equation (1). The logic circuit shown in FIG. 4 includes a register 311 for storing data R[i], a register 312 for storing data R[i+1] and a subtracter 313. Since data R[i] and R[i+1] is supplied from the data sorter 20, the distance calculator 31 is designed to include only subtracters in order to compare a distance between two neighboring data. Also, in the case of data sorted in a magnitude order, a minuend always has a value more than or equal to a corresponding subtrahend, an absolute calculation can be disregard with respect to the minuend and subtrahend.

The distance calculator 31 also uses the following equation (2) in order to obtain a distance $D_1$ between the data R[8] and R[0] stored in the median cells 21 and 29.

$$D_1=|\text{Max}-R[0]|+|R[8]-\text{Min}| \qquad (2)$$

Here, the maximum value Max and the minimum value Min are "$2\pi$" "0," respectively, in the case of data expressed as angles. The data calculator 31 prestores the maximum value Max and minimum value Min and calculates a distance between the data R[0] and R[8] using the stored values Max and Min. The distances calculated by the distance calculator 31 are input to the comparator 32. The comparator 32 compares the distances supplied from the distance calculator 31, determines a maximum distance, and generates a select control signal CTL for selecting a pair of median cells corresponding to the determined maximum distance. The generated select control signal CTL is input to the multiplexer MUX 33.

Figure 2A:
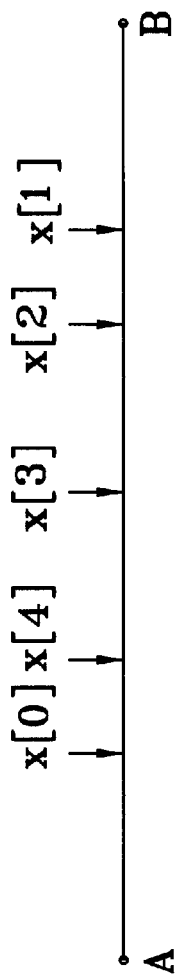
FIG. 2A is a view for explaining a definition domain of data expressed as magnitudes.
Figure 2B:
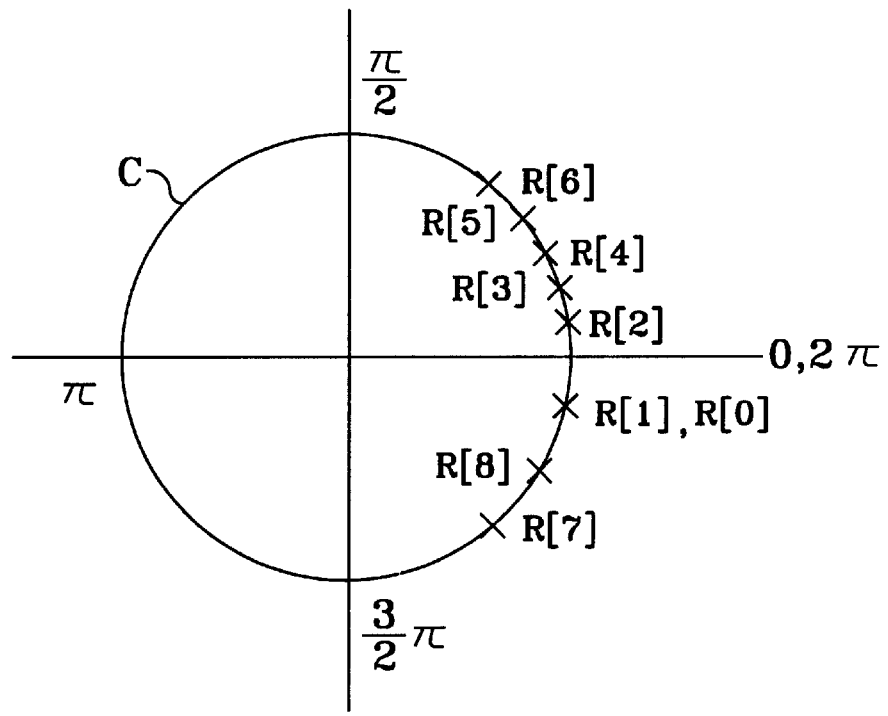
FIG. 2B is a view for explaining a definition domain of data expressed as angles.

The multiplexer 33 selects one of the data supplied from the median cells 21–29 in the data sorter 20 on the basis of the select control signal CTL received from the comparator 32, and outputs the selected data as median data MOUT. The median value of the data belonging to the definition domain shown in FIG. 2B is data which is the farthest from a pair of data in which a distance between data is the farthest when data is represented according to the magnitude on a circle C. Thus, the multiplexer 33 uses a relationship shown in the following Table, in order to select one of data supplied from the median cells 21–29 based on the select control signal CTL.

Table shows pairs having possible maximum distances and median values corresponding to each pair having a maximum distance, with respect to the nine data R[0]–R[8] being sorted in a magnitude order. The Table purposes a case where the sorted data is stored in the median cells 21–29 as shown in FIG. 3.

TABLE

| Pairs of Maximum distances | Median values |
|---|---|
| R[0], R[1] | R[5] |
| R[1], R[2] | R[6] |
| R[2], R[3] | R[7] |
| R[3], R[4] | R[8] |
| R[4], R[5] | R[0] |

TABLE-continued

| Pairs of Maximum distances | Median values |
|---|---|
| R[5], R[6] | R[1] |
| R[6], R[7] | R[2] |
| R[7], R[8] | R[3] |
| R[8], R[0] | R[4] |

The multiplexer 33 selects a pair of median cells having a maximum distance based on the select control signal CTL received from the comparator 33. Then, the multiplexer 33 determines a median corresponding to the determined pair of median cells on the basis of the above Table, and outputs the data received from the median cell which stores the median determined among the data supplied from the median cells 21–29, as median data MOUT.

The above-described FIG. 3 median filter has been described with respect to data expressed as angles. However, the median filter of FIG. 3 outputs a median value with respect to data expressed as magnitudes as well in the same manner as that of the existing median filter. This is because a pair of median cells having a maximum distance among the sorted data are median cells which always store R[0] and R[8], respectively.

As described above, the circular median filter according to the present invention can provide a desired median value with respect to both data expressed as magnitudes and data expressed as angles.

While only certain embodiments of the invention have been specifically described herein, it will be apparent that numerous modifications may be made thereto without departing from the spirit and scope of the invention.

What is claimed is:

1. A circular median filter comprising:

a plurality of median cells responsive to externally input data for deleting a firstly input data among a plurality of prestored data, sorting a plurality of data including the remaining prestored data and a newly input data after deletion of the firstly input data on the basis of a data magnitude, and storing the sorted data; and a median determiner for receiving the sorted data from said plurality of median cells, selecting particular data corresponding to a maximum distance from the received sorted data, and outputting the selected particular data as median data, wherein the maximum distance is a maximum value among distances representing differences between the sorted data stored in two neighboring median cells among said plurality of median cells, and wherein the particular data is data received from a median cell which is the farthest from the two median cells corresponding to the maximum distance.

2. The circular median filter according to claim 1, wherein said median determiner comprises:

a distance calculator for calculating distances between two neighboring data with respect to the plurality of data supplied from said plurality of median cells;

a comparator for comparing the distances calculated in said distance calculator and generating a select control signal for selecting a pair of median cells corresponding to the maximum distance; and a multiplexer for selecting data supplied from the median cell which is the farthest from the two median cells corresponding to the maximum distance in response to the select control signal generated in the comparator, and outputting the selected data as median data.

3. The circular median filter according to claim 1, wherein said distance calculator calculates a distance $D_{2i}$ between two data stored in two neighboring median cells among the stored data by $$D_{2i}=|R[i]-R[i+1]|$$

where R[i] and R[i+1] represent data stored in the two neighboring median cells, and a distance $D_1$ between a maximum value and a minimum value of the sorted data by $$D_1=|\text{Max}-R[\text{Max}]|+|[\text{Min}]-\text{Min}|$$

where Max and Min represent a maximum value and a minimum value which can be possessed by the input data, respectively and R[Max] and R[Min] represent the maximum value and the minimum value of the sorted data, respectively.

4. The circular median filter according to claim 1, wherein said median determiner outputs median data among the data expressed as magnitudes.

5. The circular median filter according to claim 1, wherein said median determiner outputs median data among the data expressed as angles.

* * * * *

UNITED STATES PATENT AND TRADEMARK OFFICE
CERTIFICATE OF CORRECTION

PATENT NO. : 5,968,111                              Page 1 of 2
DATED      : October 19, 1999
INVENTOR(S) : Moo-Ho Bae, Ju-Hyung Lee It is certified that error appears in the above-indentified patent and that said Letters Patent is hereby corrected as shown below:

PATENT ISSUED WITH WRONG FIGURE 2B
CORRECT FIGURE 2B IS ATTACHED HERETO.

Signed and Sealed this

Sixth Day of March, 2001

Attest:

NICHOLAS P. GODICI

Attesting Officer         Acting Director of the United States Patent and Trademark Office